United States Patent
Yoshida et al.

(10) Patent No.: US 11,060,025 B2
(45) Date of Patent: Jul. 13, 2021

(54) OXYNITRIDE FLUORESCENT MATERIAL, LIGHT EMITTING DEVICE, AND METHOD FOR PRODUCING OXYNITRIDE FLUORESCENT MATERIAL

(71) Applicant: NICHIA CORPORATION, Anan (JP)

(72) Inventors: Shigeki Yoshida, Anan (JP); Shoji Hosokawa, Tokushima (JP)

(73) Assignee: NICHIA CORPORATION, Anan (JP)

( * ) Notice: Subject to any disclaimer, the term of this patent is extended or adjusted under 35 U.S.C. 154(b) by 272 days.

(21) Appl. No.: 16/224,216

(22) Filed: Dec. 18, 2018

(65) Prior Publication Data

US 2019/0194540 A1   Jun. 27, 2019

(30) Foreign Application Priority Data

Dec. 26, 2017  (JP) .............................. JP2017-250026
Dec. 13, 2018  (JP) .............................. JP2018-233446

(51) Int. Cl.
   *C09K 11/77*   (2006.01)
   *H01L 33/50*   (2010.01)
   *C09K 11/08*   (2006.01)

(52) U.S. Cl.
   CPC ...... *C09K 11/7792* (2013.01); *C09K 11/0883* (2013.01); *C09K 11/77927* (2021.01); *H01L 33/502* (2013.01); *H01L 33/504* (2013.01)

(58) Field of Classification Search
   CPC ............ C09K 11/7792; C09K 11/0883; H01L 33/504; H01L 33/502
   See application file for complete search history.

(56) References Cited

U.S. PATENT DOCUMENTS

| | | | |
|---|---|---|---|
| 7,858,997 B2 | 12/2010 | Yoshimura et al. | |
| 8,808,577 B2 | 8/2014 | Becker et al. | |
| 9,416,313 B2 * | 8/2016 | Nitta .................. | C09K 11/7734 |
| 10,160,905 B2 | 12/2018 | Li | |
| 2005/0001225 A1 | 1/2005 | Yoshimura et al. | |
| 2007/0164308 A1 | 7/2007 | Yoshimura et al. | |
| 2011/0186778 A1 | 8/2011 | Becker et al. | |
| 2015/0055358 A1 | 2/2015 | Nitta et al. | |
| 2018/0171220 A1 | 6/2018 | Li | |

FOREIGN PATENT DOCUMENTS

| | | | |
|---|---|---|---|
| CN | 102344797 | * | 2/2012 |
| CN | 106479498 | * | 3/2017 |
| DE | 102007035592 A1 | | 2/2009 |
| JP | 2000345152 A | | 12/2000 |
| JP | 2004186278 A | | 7/2004 |
| JP | 2004-277547 A | | 10/2004 |
| JP | 2006152242 A | | 6/2006 |
| JP | 2010-534755 A | | 11/2010 |
| JP | 2013-047349 A | | 3/2013 |
| JP | 2015061902 A | | 4/2015 |
| WO | 2017006725 A1 | | 1/2017 |

OTHER PUBLICATIONS

Translation for CN 102344797, Feb. 8, 2012.*
Translation for CN 106479498, Mar. 8, 2017.*

* cited by examiner

*Primary Examiner* — C Melissa Koslow

(74) *Attorney, Agent, or Firm* — Hunton Andrews Kurth LLP

(57) ABSTRACT

Provided are an oxynitride fluorescent material, a light emitting device, and a method for producing an oxynitride fluorescent material. The oxynitride fluorescent material containing a composition represented by the following formula (I): $(Ba_{1-a}Eu_a)_{1-b}M_bSi_2O_{2+c}N_{2+d}$ (I), wherein in the formula (I), M represents at least one element selected from the group consisting of rare earth elements excluding Eu and Sm; and a, b, c, and d each satisfy $0<a\leq1.0$, $0<b\leq0.07$, $-0.3<c<0.3$, and $-0.3<d<0.3$.

11 Claims, 9 Drawing Sheets

OXYNITRIDE FLUORESCENT MATERIAL, LIGHT EMITTING DEVICE, AND METHOD FOR PRODUCING OXYNITRIDE FLUORESCENT MATERIAL

CROSS-REFERENCE TO RELATED PATENT APPLICATION

This application claims priority to Japanese Patent Application No. 2017-250026, filed on Dec. 26, 2017, and Japanese Patent Application No. 2018-233446, filed on Dec. 13, 2018, the entire disclosures of which are incorporated herein by references in their entirety.

BACKGROUND

Technical Field

The present invention relates to an oxynitride fluorescent material, a light emitting device, and a method for producing an oxynitride fluorescent material. In this specification the "fluorescent material" is used in the same meaning as a "fluorescent phosphor".

Description of Related Art

A light emitting device having a combination of a light emitting element, such as a light emitting diode (which may be hereinafter referred to as an "LED") or a laser diode (which may be hereinafter referred to as an "LD"), and a fluorescent material is a light source having a high conversion efficiency, and is being utilized as a light source that replaces a filament lamp and a fluorescent lamp, owing to the small electric power consumption, the long lifetime, and the capability of size reduction thereof.

As the fluorescent material used in the light emitting device, for example, Japanese Unexamined Patent Publication No. 2004-277547 discloses an oxynitride fluorescent material represented by the formula $Ba_pSi_qO_r N_{(2/3)p+(4/3)q-(2/3)r}$:Eu (wherein $0.5<p<1.5$, $1.5<q<2.5$, and $1.5<r<2.5$). The oxynitride fluorescent material emits light of blue-green color to yellow color through excitation with an excitation light source in an ultraviolet to visible region.

However, the enhancement of the light emission intensity and the further improvement of the temperature characteristics are being demanded for the aforementioned oxynitride fluorescent material.

In some embodiments of the present disclosure, accordingly, an object thereof is to provide an oxynitride fluorescent material that has a high light emission intensity and good temperature characteristics, a light emitting device, and a method for producing an oxynitride fluorescent material.

SUMMARY

Means for solving the problem encompass the following embodiments.

A first embodiment of the present disclosure is an oxynitride fluorescent material comprising a composition represented by the following formula (I):

$$(Ba_{1-a}Eu_a)_{1-b}M_bSi_2O_{2+c}N_{2+d} \quad (I)$$

wherein in the formula (I), M represents at least one kind of an element selected from the group consisting of rare earth elements excluding Eu and Sm; and a, b, c, and d each satisfy $0<a \leq 1.0$, $0<b \leq 0.07$, $-0.3<c<0.3$, and $-0.3<d<0.3$.

A second embodiment of the present disclosure is a light emitting device comprising the oxynitride fluorescent material and an excitation light source having a light emission peak wavelength in a range of 380 nm or more and 485 nm or less.

A third embodiment of the present disclosure is a method for producing the oxynitride fluorescent material according to the first embodiment, comprising: preparing a mixture containing a compound containing Ba, a compound containing Eu, a compound containing at least one kind of an element M selected from the group consisting of rare earth elements excluding Eu and Sm, and a compound containing Si, any of the compounds being a compound containing oxygen, depending on necessity any of the compounds being a compound containing nitrogen; and calcining the mixture.

According to some embodiments of the present disclosure, an oxynitride fluorescent material that has a high light emission intensity and good temperature characteristics, a light emitting device, and a method for producing an oxynitride fluorescent material can be provided.

DETAILED DESCRIPTION

Figure 1:
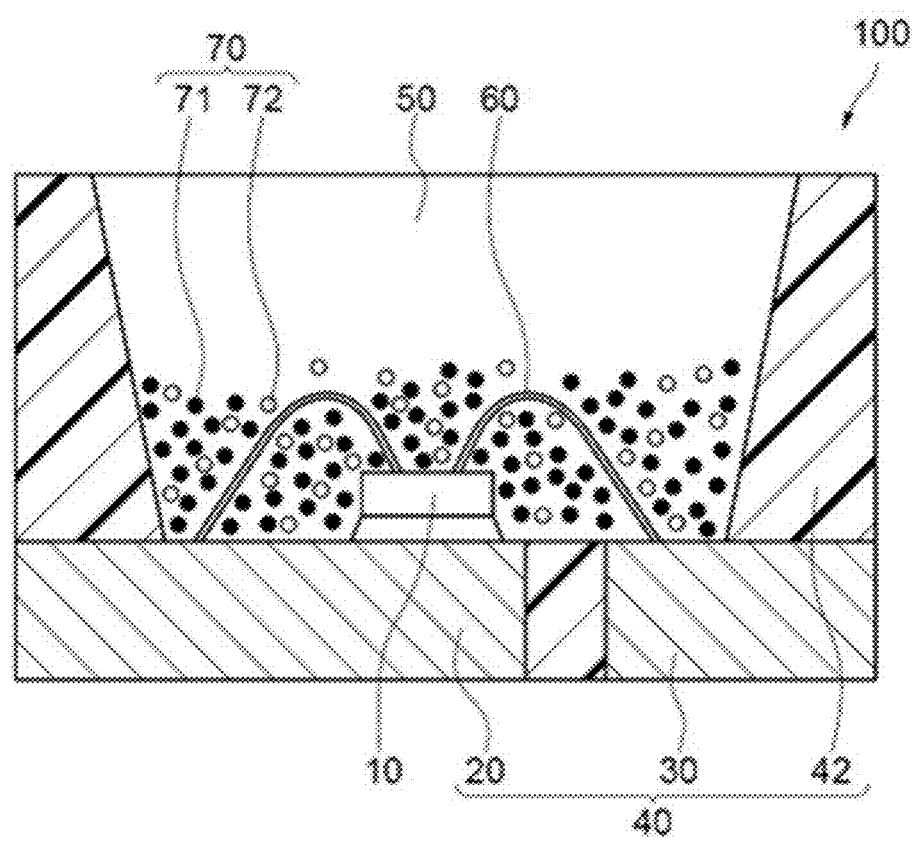
FIG. 1 is a schematic cross sectional view showing a light emitting device according to an embodiment of the present disclosure.

The oxynitride fluorescent material, the light emitting device, and the method for producing an oxynitride fluorescent material according to the present invention will be described with reference to embodiments below. However, the embodiments described below are only examples for practicing the technical concept of the present invention, and the present invention is not limited to the oxynitride fluorescent materials, the light emitting devices, and the methods for producing an oxynitride fluorescent material described below. The relationships between the color names and the chromaticity coordinates, the relationships between the wavelength ranges of light and the color names of monochromatic light, and the like are in accordance with JIS Z8110.

Oxynitride Fluorescent Material

The oxynitride fluorescent material according to the first embodiment of the present disclosure contains a composition represented by the following formula (I):

$$(Ba_{1-a}Eu_a)_{1-b}M_bSi_2O_{2+c}N_{2+d} \quad (I)$$

wherein in the formula (I), M represents at least one kind of an element selected from the group consisting of rare earth elements excluding Eu and Sm; and a, b, c, and d each satisfy $0<a\leq1.0$, $0<b\leq0.07$, $-0.3<c<0.3$, and $-0.3<d<0.3$.

The oxynitride fluorescent material according to the first embodiment of the present disclosure containing a composition represented by the formula (I) is efficiently excited with light from a light emitting element having a light emission peak wavelength in a range of 380 nm or more and 485 nm or less (which may be hereinafter referred to as a "near ultraviolet to blue region") to emit light of blue-green color, and an oxynitride fluorescent material having a high light emission intensity can be provided as described later. The oxynitride fluorescent material according to the first embodiment of the present invention is also excellent in temperature characteristics. Specifically, an oxynitride fluorescent material having good temperature characteristics capable of suppressing color variation even under operation at a high temperature or under continuous lighting for a prolonged period of time at a high temperature can be provided.

In the formula (I), M represents at least one kind of an element selected from the group consisting of rare earth elements excluding Eu and Sm (which may be hereinafter referred to as an "element M"). The oxynitride fluorescent material having a composition represented by the formula (I) contains Eu as an activating element, and M, which is at least one kind of an element selected from the group consisting of rare earth elements excluding Eu and Sm. Apart of M is incorporated to the crystal structure of the fluorescent material while keeping balance between the negative charge including oxygen and nitrogen and the positive charge including Ba, Eu, M, and Si in the composition of the fluorescent material. While the production method will be described later, it is considered that a part of the compound containing M contained in the raw material of the oxynitride fluorescent material of the present embodiment functions as a flux in calcining the mixture as the raw material, and a part of M is incorporated to the crystal structure of the fluorescent material. Accordingly, the oxynitride fluorescent material of the present embodiment becomes fluorescent material particles having high crystallinity with less defects, and is efficiently excited with light from a light emitting element having a light emission peak wavelength in a near ultraviolet to blue region to emit light of blue-green color with a higher light emission intensity than the case where M is not contained.

In the formula (I), M is preferably at least one rare earth element selected from the group consisting of Y, La, Ce, Pr, Nd, Gd, Tb, Dy, Ho, Er, Tm, Yb, and Lu. In the formula (I), M is more preferably at least one kind of an element selected from the group consisting of Y, La, Ce, Pr, Nd, Tb, and Dy. The oxynitride fluorescent material containing a composition represented by the formula (I) contains M, and thus is efficiently excited with light from a light emitting element having a light emission peak wavelength in a near ultraviolet to blue region, and an oxynitride fluorescent material having a high light emission intensity can be provided.

In the formula (I), M is particularly preferably at least one kind of an element selected from the group consisting of La, Ce, Pr, and Nd. The oxynitride fluorescent material containing a composition represented by the formula (I) may contain M wherein M is at least one kind of element selected from the group consisting of La, Ce, Pr, and Nd, along with Eu. M having an ionic radius that is closer to the ionic radius of Ba ion is more easily contained in the oxynitride fluorescent material through substitution for Ba and Eu, providing fluorescent material particles having high crystallinity with less defects, which are thus efficiently excited with light from a light emitting element having a light emission peak wavelength in a near ultraviolet to blue region, so as to emit light of blue-green color with a high light emission intensity. In the case where M in the formula (I) is at least one kind of an element selected from the group consisting of La, Ce, Pr, and Nd, an oxynitride fluorescent material capable of suppressing color variation even under operation at a high temperature or under continuous lighting for a prolonged period of time at a high temperature can be provided.

In the formula (I), the parameter a shows the activation amount of Eu in terms of molar ratio of the oxynitride fluorescent material containing a composition represented by the formula (I). In the description herein, the "molar ratio" means the molar ratios of the element in 1 mol of the chemical composition represented by the formula (I). In the formula (I), a parameter a satisfies $0<a\leq1.0$. In the case where the parameter a is 0 in the formula (I), Eu as an activator is not present in the oxynitride, and the oxynitride does not emit light even under irradiation with excitation light. The case where the parameter a is 1.0 in the formula (I) means that the Ba sites in the crystal structure are entirely substituted by Eu, and an oxynitride fluorescent material that emits light under irradiation of excitation light can be obtained even when the Ba sites are entirely substituted by Eu. In the formula (I), the parameter a satisfies preferably $0.001\leq a<1.0$, more preferably $0.001\leq a\leq0.5$, further preferably $0.001\leq a\leq0.3$, and still further preferably $0.001\leq a\leq0.1$. When the molar ratio of Eu as an activating element is increased, the light emission intensity is increased to a certain range, but there are cases where concentration quenching occurs due to the increase of Eu to decrease the light emission intensity.

In the formula (I), a parameter b shows the molar ratio of M selected from the group consisting of rare earth elements excluding Eu and Sm in the oxynitride fluorescent material containing a composition represented by the formula (I). In the formula (I), the parameter b satisfies $0<b\leq0.07$, and in the case where the parameter b is 0, M is not present in the oxynitride fluorescent material, and the light emission intensity of the oxynitride fluorescent material cannot be improved to a high level. In the case where the parameter b in the formula (I) exceeds 0.07, i.e., the amount of M incorporated in the crystal structure is increased, it is estimated that the energy contributing to the light emission of Eu as an activator is absorbed by the element M, thereby deteriorating the light emission characteristics. In the formula (I), the parameter b satisfies preferably $0.001\leq b\leq0.06$, more preferably $0.001\leq b\leq0.05$, and further preferably $0.001\leq b\leq0.045$.

For the oxynitride fluorescent material containing a composition represented by the formula (I), it is preferred that M in the formula (I) is at least one element selected from the group consisting of La, Ce, Pr, and Nd, and the parameters a and b in the formula (I) each satisfy $0.001\leq a<0.1$ and $0.001\leq b\leq0.05$. In the case where the oxynitride fluorescent material containing a composition represented by the formula (I) contains M wherein M is at least one element selected from the group consisting of La, Ce, Pr, and Nd, along with Eu, and in the composition contained in the oxynitride fluorescent material, the parameter a showing the molar ratio of Eu satisfies $0.001 \leq a < 0.1$, and the parameter b showing the molar ratio of M satisfies $0.001 \leq b \leq 0.05$, the oxynitride fluorescent material can be improved in the light emission intensity to a high level, and simultaneously can be improved in the temperature characteristics. With the oxynitride fluorescent material containing M wherein M is at least one element selected from the group consisting of La, Ce, Pr, and Nd in the composition represented by the formula (I), an oxynitride fluorescent material capable of suppressing color variation even under operation at a high temperature or under continuous lighting for a prolonged period of time at a high temperature can be provided.

In the formula (I), a parameter c shows the value that varies with respect to 2, which is the molar ratio of oxygen (O), in the case where the molar ratio of Si is 2, in the composition represented by the formula (I). In the formula (I), a parameter d shows the value that varies with respect to 2, which is the molar ratio of nitrogen (N), in the case where the molar ratio of Si is 2, in the composition represented by the formula (I).

In the case where the parameter c satisfies $-0.3 < c < 0.3$, and the parameter d satisfies $-0.3 < d < 0.3$, the negative charge including oxygen and nitrogen and the positive charge including Ba, Eu, M, and Si may be easily balanced, so as to retain the crystal structure of the oxynitride represented by $BaSi_2O_2N_2$, which is the basic composition of the fluorescent material of the present disclosure, and the stable crystal structure thereof may contribute to the improvement of the light emission characteristics. In the case where the parameter c is −0.3 or less, or the parameter d is −0.3 or less, or in the case where the parameter c is 0.3 or more, or the parameter d is 0.3 or more, on the other hand, the tetrahedral structure represented by $SiON_3$ constituting the crystal structure represented by $BaSi_2O_2N_2$ may be changed to alter the part of the crystal structure, resulting in decrease of the light emission intensity in some cases.

The oxynitride fluorescent material containing a composition represented by the formula (I) preferably has an average particle diameter in a range of 3 µm or more and 50 µm or less, more preferably in a range of 5 µm or more and 40 µm or less, further preferably in a range of 6 µm or more and 30 µm or less, and still further preferably in a range of 7 µm or more and 20 µm or less. In the case where the average particle diameter of the oxynitride fluorescent material containing a composition represented by the formula (I) is 3 µm or more and 50 µm or less, the oxynitride fluorescent material may well absorb light from a light emitting element having a light emission peak wavelength in a near ultraviolet to blue region, and have a high light emission intensity. The average particle diameter of the oxynitride fluorescent material containing a composition represented by the formula (I) means the particle diameter where the volume cumulative frequency reaches 50% from the small diameter side (i.e., the median diameter) in the volume-based particle size distribution by the laser diffractive scattering particle size distribution measuring method. For the laser diffractive scattering particle size distribution measuring method, the measurement may be performed, for example, with a laser diffractive particle size distribution measuring instrument (Mastersizer 3000, manufactured by Malvern Panalytical, Ltd.).

Light Emitting Device

An example of a light emitting device according to a second embodiment of the present disclosure containing the oxynitride fluorescent material having the composition represented by the formula (I) will be described with reference to the drawing. FIG. 1 is a schematic cross sectional view showing a light emitting device 100 according to the second embodiment of the present invention.

The light emitting device 100 has a molded article 40, a light emitting element 10, and a fluorescent member 50. The molded article 40 contains a first lead 20 and a second lead 30, which are molded integrally with a resin part 42 containing a thermoplastic resin or a thermosetting resin. The molded article 40 has formed therein a depressed portion having a bottom surface and a side surface, and the light emitting element 10 is disposed on the bottom surface of the depressed portion. The light emitting element 10 has a pair of anode and cathode, and the pair of anode and cathode is electrically connected to the first lead 20 and the second lead 30 respectively through wires 60. The light emitting element 10 is covered with the fluorescent member 50. The fluorescent member 50 contains, for example, a fluorescent material 70 that performs wavelength conversion of light emitted from the light emitting element 10, and a resin. The fluorescent material 70 contains a first fluorescent material 71 and a second fluorescent material 72. The first lead 20 and the second lead 30 connected to the pair of anode and cathode of the light emitting element 10 are directed toward the outside of the molded article 40 constituting the light emitting device 100, so as to expose parts of the first lead 20 and the second lead 30. The light emitting device 100 can emit light with electric power supplied from the outside through the first lead 20 and the second lead 30.

The light emitting element 10 is used as an excitation light source, and preferably has a light emission peak in a wavelength range of 380 nm or more and 485 nm or less. The light emission peak wavelength of the light emitting element 10 is more preferably in a range of 390 nm or more and 480 nm or less, and further preferably in a range of 420 nm or more and 470 nm or less. The light emission spectrum of the light emitting element 10 may have a full width at half maximum, for example, of 30 nm or less.

The light emitting element 10 used is preferably a semiconductor light emitting element using, for example, a nitride semiconductor ($In_xAl_yGa_{1-X-Y}N$, $0 \leq X$, $0 \leq Y$, $X+Y \leq 1$). The use of a semiconductor light emitting element as the light source may provide a light emitting device that has a high efficiency and a high linearity of output with respect to input, and is stable with resistance to a mechanical impact.

The light emitting device 100 preferably contains at least the oxynitride fluorescent material containing a composition represented by the formula (I) according to the first embodiment, and an excitation light source having a light emission peak wavelength in a range of 380 nm or more and 485 nm or less.

The first fluorescent material 71 preferably contains the oxynitride fluorescent material containing a composition represented by the formula (I) according to the first embodiment. In the case where the first fluorescent material 71 is the oxynitride fluorescent material containing a composition represented by the formula (I), the fluorescent material can be efficiently excited with light emitted from the excitation light source having a light emission peak wavelength in a range of 380 nm or more and 485 nm or less, and the light emitting device 100 that emits mixed light of the light from the light emitting element 10 and the fluorescent light from the fluorescent material 70 containing the first fluorescent material 71 can be constituted owing to the oxynitride fluorescent material having a high light emission intensity.

The first fluorescent material 71 may contain the oxynitride fluorescent material containing a composition represented by the formula (I) according to the first embodiment, and may be contained, for example, in the fluorescent member 50 covering the light emitting element 10. In the light emitting device 100 having the light emitting element 10 covered with the fluorescent member 50 containing the first fluorescent material 71, a part of light emitted from the light emitting element 10 is absorbed by the oxynitride fluorescent material containing a composition represented by the formula (I) and emitted as blue-green light. The use of the light emitting element 10 emitting light having a light emission peak wavelength in a range of 380 nm or more and 485 nm or less can provide a light emitting device that has a high light emission efficiency.

The fluorescent member 50 preferably contains the second fluorescent material 72 having a light emission peak wavelength that is different from the first fluorescent material 71. For example, the light emitting device 100 may have the light emitting element 10 emitting light having a light emission peak wavelength in a range of 380 nm or more and 485 nm or less, and appropriately may have the first fluorescent material 71 and the second fluorescent material 72, which are excited with the light, and thereby a wide color reproduction range and a high color rendering property can be obtained.

The second fluorescent material 72 suffices to be a fluorescent material that absorbs the light emitted from the light emitting element 10 and performs wavelength conversion to light having a different wavelength from the first fluorescent material 71. Examples thereof include $(Ca,Sr,Ba)_2SiO_4$:Eu, $(Ca,Sr,Ba)_8MgSi_4O_{16}(F,Cl,Br)_2$:Eu, $Si_{6-z}Al_zO_zN_{8-z}$:Eu $(0<z\leq4.2)$, $(Sr,Ba,Ca)Ga_2S_4$:Eu, $(Lu,Y,Gd,Lu)_3(Ga,Al)_5O_{12}$:Ce, $(La,Y,Gd)_3Si_6N_{11}$:Ce, $Ca_3Sc_2Si_3O_{12}$:Ce, $CaSc_2O_4$:Ce, $K_2(Si,Ge,Ti)F_6$:Mn, $(Ca,Sr,Ba)_2Si_5N_8$:Eu, $CaAlSiN_3$:Eu, $(Ca,Sr)AlSiN_3$:Eu, $(Sr,Ca)LiAl_3N_4$:Eu, $(Ca,Sr)_2Mg_2Li_2Si_2N_6$:Eu, $3.5MgO\cdot0.5MgF_2\cdot GeO_2$:Mn, $Sr_3SiO_5$:Eu, and $(Ca,Sr,Li,Y)_x(Si,Al)_{12}(O,N)_{16}$:Eu $(0\leq x\leq3)$. In the description herein, the plural elements delimited with commas (,) in the formula showing the composition of the fluorescent material mean that the composition contains at least one kind of the plural elements delimited with commas. In the description herein, the term before the colon (:) shows the mother crystal, and the term after the colon (:) shows the activating element in the formula showing the composition of the fluorescent material.

The fluorescent material 70 containing the first fluorescent material 71 and the second fluorescent material 72 constitutes the fluorescent member 50 covering the light emitting element, along with a sealing material. Examples of the sealing material constituting the fluorescent member 50 include a silicone resin and an epoxy resin.

The light emitting device according to the second embodiment of the present disclosure contains the oxynitride fluorescent material according to the first embodiment of the present disclosure, and thereby the light emitting device has a high light emission intensity, and can suppress color variation even under operation at a high temperature or under continuous lighting for a prolonged period of time at a high temperature, thereby providing a light emitting device excellent in color rendering property and color reproducibility.

Method for Producing Oxynitride Fluorescent Material

The method for producing an oxynitride fluorescent material according to the third embodiment of the present disclosure is a method for producing an oxynitride fluorescent material containing a composition represented by the following formula (I), including: preparing a mixture containing a compound containing Ba, a compound containing Eu, a compound containing M wherein M is at least one element selected from the group consisting of rare earth elements excluding Eu and Sm, and a compound containing Si, any of the compounds being a compound containing oxygen, any of the compounds optionally being a compound containing nitrogen; and calcining the mixture:

$$(Ba_{1-a}Eu_a)_{1-b}M_bSi_2O_{2+c}N_{2+d} \qquad (I)$$

wherein in the formula (I), M represents at least one kind of an element selected from the group consisting of rare earth elements excluding Eu and Sm; and a, b, c, and d each satisfy $0<a\leq1.0$, $0<b\leq0.07$, $-0.3<c<0.3$, and $-0.3<d<0.3$.

In the formula (I), M represents at least one element selected from the group consisting of rare earth elements excluding Eu and Sm, preferably at least one rare earth element selected from the group consisting of Y, La, Ce, Pr, Nd, Gd, Tb, Dy, Ho, Er, Tm, Yb, and Lu, more preferably at least one element selected from the group consisting of Y, La, Ce, Pr, Nd, Tb, and Dy, and further preferably at least one element selected from the group consisting of La, Ce, Pr, and Nd.

Mixture

The method for producing an oxynitride fluorescent material according to the third embodiment of the present disclosure uses a raw material containing a compound containing Ba, a compound containing Eu, a compound containing at least one kind of an element M selected from the group consisting of rare earth elements excluding Eu and Sm, and a compound containing Si. Any of the compounds may be a compound containing oxygen. The compound containing oxygen is preferably a carbonate salt or an oxide. For at least one selected from the group consisting of the compound containing Ba, the compound containing Eu, the compound containing M, and the compound containing Si, any of the compounds may optionally be a compound containing nitrogen, and any of the compounds is preferably a nitride.

In the method for producing an oxynitride fluorescent material according to the third embodiment of the present disclosure, the oxynitride fluorescent material contains oxygen and nitrogen at the certain molar ratios, and therefore a compound containing oxygen and a compound containing nitrogen are necessarily contained at the certain molar ratio in addition to Ba, Eu, M, and Si. The compound containing oxygen may be a compound containing Ba, a compound containing Eu, or a compound containing M, as described later. The compound containing nitrogen may be a compound containing Si as described later. Examples of the compounds containing nitrogen include a nitride containing Ba, a nitride containing Si, and a nitride containing Eu.

In the method for producing an oxynitride fluorescent material according to the third embodiment of the present disclosure, the molar ratio of M contained in the mixture containing the raw materials of the oxynitride fluorescent material is preferably more than 0 and less than 0.15 assuming that the molar ratio of Si contained in the mixture is 2. In the method for producing an oxynitride fluorescent material, the molar ratio of M contained in the mixture is more preferably 0.001 or more and 0.13 or less, and further preferably 0.001 or more and 0.12 or less, assuming that the molar ratio of Si contained in the mixture is 2. In the case where the molar ratio of M contained in the mixture is more than 0 and less than 0.15 assuming that the molar ratio of Si contained in the mixture is 2, the oxynitride fluorescent material containing a composition represented by the formula (I) can be obtained, and the oxynitride fluorescent material with the composition represented by the formula (I) can contain M in the molar ratio with the parameter b satisfying $0<b\leq0.07$. The molar ratios of the elements in the mixture containing the raw materials of the oxynitride fluorescent material may be expressed as the composition during preparation or the molar ratios during preparation.

The compound containing Ba used may be a nitride, an oxide, a carbonate, a hydride, or the like containing Ba. Barium used may be a single substance of metallic barium, and examples of the compound containing Ba include $Ba_3N_2$, BaO, $BaCO_3$, $BaH_2$, and $BaNH_2$.

The compound containing Si used may be an oxide containing Si and/or a nitride containing Si. Examples of the compound containing Si include $SiO_2$ and $Si_3N_4$. Silicon used may be a single substance of metallic silicon, and an alloy obtained by replacing a part of Si with at least one kind of an element of the Group 14, such as Ge and Sn, may also be used.

The compound containing M used may be an oxide, a hydroxide, a nitride, an oxynitride, a fluoride, a chloride containing at least one kind of rare earth element selected from the group consisting of rare earth elements excluding Eu and Sm. The compound containing M is preferably an oxide since it is easily available and is a stable compound, which is good in handleability. Examples of the compound containing M include $Y_2O_3$, $La_2O_3$, $CeO_2$, $Pr_6O_{11}$, $Nd_2O_3$, $Gd_2O_3$, $Tb_4O_7$, $Dy_2O_3$, $Ho_2O_3$, $Er_2O_3$, $Tm_2O_3$, $Yb_2O_3$, and $Lu_2O_3$.

Examples of the compound containing Eu used may be an oxide, a hydroxide, a nitride, an oxynitride, a fluoride, a hydride, a chloride containing Eu. Specific examples of the compound containing Eu include $Eu_2O_3$, EuN, and $EuF_3$.

The mixture may be prepared by weighing the compound containing Ba, the compound containing Eu, the compound containing M, and the compound containing Si.

The mixture may be prepared by mixing the weighed raw materials with a mixer by a wet method or a dry method. The mixer used may be a ball mill, which is generally used industrially, and may also be a pulverizer, such as a vibration mill, a roll mill, and a jet mill, with which the mixture may be pulverized to increase the specific surface area thereof. For making the specific surface area of the powder to a certain range, the mixture may be classified with a wet separator, such as a sedimentation tank, a hydrocyclone, and a centrifugal separator, or a dry classifier, such as a cyclone and an air separator, which are generally used industrially.

The mixture is placed on a crucible or a boat formed of such a material as carbon, such as graphite, boron nitride (BN), alumina ($Al_2O_3$), tungsten (W), or molybdenum (Mo), and subjected to a heat treatment in a furnace, so as to provide a calcined product.

Calcining Step

In the method for producing an oxynitride fluorescent material according to the third embodiment of the present disclosure, the mixture is preferably calcined in a reducing atmosphere. The reducing atmosphere preferably contains nitrogen. The reducing atmosphere may contain nitrogen and may also contain at least one kind of hydrogen, argon, carbon dioxide, carbon monoxide, and ammonia, as an additional gas. The reducing atmosphere is preferably an atmosphere containing hydrogen in addition to nitrogen, and the reducing atmosphere preferably contains hydrogen gas in an amount of 1% by volume or more, more preferably 5% by volume or more, and further preferably 10% by volume or more.

In the production method according to the third embodiment of the present disclosure, the mixture may be calcined in a reducing atmosphere to provide an oxynitride fluorescent material having a target composition. In the case where the reducing atmosphere is an atmosphere containing nitrogen gas and hydrogen gas, an oxynitride fluorescent material having a higher light emission intensity can be obtained. This occurs in such a mechanism that the oxynitride fluorescent material of the present invention contains Eu as an activating element, and the proportion of divalent Eu contributing light emission in the oxynitride fluorescent material is increased by calcining the mixture in the reducing atmosphere. While divalent Eu easily becomes trivalent Eu through oxidation, trivalent Eu can be reduced to divalent Eu by calcining the mixture in the reducing atmosphere containing hydrogen and nitrogen having high reducing power, so as to increase the proportion of divalent Eu in the resulting oxynitride fluorescent material, and thus an oxynitride fluorescent material having a high light emission intensity can be obtained.

The calcining temperature for providing the calcined material is preferably in a range of 1,300° C. or more and 1,600° C. or less, and more preferably in a range of 1,400° C. or more and 1,600° C. or less. In the case where the calcining temperature is in a range of 1,300° C. or more and 1,600° C. or less, an oxynitride fluorescent material can be obtained that has a target composition, has a stable crystal structure, and has a sufficient light emission intensity. The calcining may be performed by multistage calcining, in which the first stage calcining is performed at a temperature in a range of 800° C. or more and 1,000° C. or less, and after gradually heating, the second stage calcining is performed at a temperature in a range of 1,100° C. or more and 1,300° C. or less. In the case where the calcining temperature in the first stage is in a range of 800° C. or more and 1,000° C. or less, a calcined material having a target composition can be easily obtained. In the case where the calcining temperature in the second stage is in a range of 1,100° C. or more and 1,300° C. or less, the resulting oxynitride fluorescent material can be suppressed from being decomposed, and an oxynitride fluorescent material can be easily obtained that has a stable crystal structure and has a sufficient light emission intensity.

The calcining may be performed by using a horizontal tubular furnace or a box atmosphere furnace. The pressure in the calcining is preferably an atmosphere of 0.1 MPa or more and 200 MPa or less in terms of gauge pressure. In the oxynitride fluorescent material obtained through calcining, while the crystal structure is more easily decomposed when the calcining temperature becomes a higher temperature, the decomposition of the crystal structure can be suppressed by using the atmosphere with the aforementioned pressure, and the light emission intensity can be suppressed from being decreased. The pressure of the calcining atmosphere may be, for example, the atmosphere pressure (standard atmospheric pressure of approximately 0.1 MPa), and is more preferably in a range of 0.1 MPa or more and 100 MPa or less, and from the standpoint of the easiness of production, is further preferably 1.0 MPa or less.

The calcining time can be appropriately selected depending on the calcining temperature and the pressure of the atmosphere in calcining, and is preferably in a range of 0.5 hour or more and 20 hours or less, and in the case where the multistage calcining is performed, the calcining time per one time of calcining is preferably in a range of 0.5 hour or more and 20 hours or less. In the case where the calcining time is in a range of 0.5 hour or more and 20 hours or less, the resulting oxynitride fluorescent material can be suppressed from being decomposed, and an oxynitride fluorescent material can be obtained that has a stable crystal structure and has a sufficient light emission intensity. In the case where the calcining time is in a range of 0.5 hour or more and 20 hours or less, the production cost can be decreased, and the production time can be relatively shortened. The heat treatment time is more preferably in a range of 1 hour or more and 15 hours or less, and further preferably in a range of 1.5 hours or more and 12 hours or less.

Post-Treatment after Calcining

In the production method according to the third embodiment of the present disclosure, the calcined material obtained after calcining may be subjected to a post-treatment of pulverizing and mixing with a ball mill, a vibration mill, a hammer mill, a mortar and a pestle. The post-treatment may include a classification operation performed by sieving or sedimentation for controlling the particle diameter, in addition to the pulverization and mixing. The classification may be performed by a method generally used industrially, for example, wet classification, such as sedimentation classification, mechanical classification, hydraulic classification, and centrifugal classification, or sieving classification. The post-treatment may also include, for example, an acid cleaning treatment performed after the classification, in addition to the pulverization and mixing, and the classification. The acid cleaning treatment may remove impurities attached to the surface of the calcined product. The acid cleaning treatment is preferably performed by using a hydrochloric acid aqueous solution, which is easily available and is inexpensive. The concentration of hydrochloric acid in the hydrochloric acid aqueous solution is preferably such a concentration that can remove impurities on the surface of the calcined product and does not affect the crystal structure of the calcined product.

The oxynitride fluorescent material containing a composition represented by the formula (I) can be obtained by the production method according to the third embodiment of the present disclosure. The oxynitride fluorescent material containing a composition represented by the formula (I) thus obtained has a high light emission intensity, is excellent in temperature characteristics, and is suppressed in color variation even under operation at a high temperature or under continuous lighting for a prolonged period of time at a high temperature.

EXAMPLES

The present invention is hereunder specifically described by reference to the following Examples and Comparative Examples. The present invention is not limited to these Examples.

Example 1

Preparation of Mixture

Barium carbonate ($BaCO_3$), silicon oxide ($SiO_2$), silicon nitride ($Si_3N_4$), europium oxide ($Eu_2O_3$), and yttrium oxide ($Y_2O_3$) as raw materials were weighed to make a composition during preparation of 0.98:2:0.02:0.074 in terms of molar ratio of Ba:Si:Eu:Y, and the raw materials thus weighed were mixed with a dry ball mill to provide a mixture. The molar ratio during preparation of the elements constituting an oxynitride fluorescent material of Example 1 is shown in Table 1. The composition during preparation and the molar ratio during preparation herein show the molar ratios of the elements of Ba, Eu, M, and Si in the mixture containing the raw materials of the oxynitride fluorescent material.

Calcining Step

The resulting mixture was molded to a bulk form on a boron nitride boat, and calcined in a reducing atmosphere containing nitrogen and hydrogen gas (hydrogen gas: 4% by volume, nitrogen gas: 96% by volume) under the atmosphere pressure (standard atmospheric pressure of approximately 0.1 MPa) at 1,450° C. for 10 hours, so as to provide a calcined product. The resulting calcined product was pulverized with an agate mortar, and then coarse particles exceeding the mesh size of a sieve having a mesh size of 50 μm were removed. The pulverized calcined product was acid-cleaned with a hydrochloric acid aqueous solution and then rinsed with water, and the particles were isolated and dried to provide the oxynitride fluorescent material of Example 1.

Examples 2 to 13

Barium carbonate ($BaCO_3$), silicon oxide ($SiO_2$), silicon nitride ($Si_3N_4$), europium oxide ($Eu_2O_3$), and an oxide containing a rare earth element as raw materials were weighed, and the raw materials thus weighed were mixed with a dry ball mill to provide a mixture. The oxide containing a rare earth element used was specifically lanthanum oxide ($La_2O_3$), cerium oxide ($CeO_2$), praseodymium oxide ($Pr_6O_{11}$), neodymium oxide ($Nd_2O_3$), gadolinium oxide ($Gd_2O_3$), terbium oxide ($Tb_4O_7$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), or lutetium oxide ($Lu_2O_3$). Oxynitride fluorescent materials of Examples 2 to 13 were obtained in the same manner as in Example 1 except that the mixture prepared above was used. The molar ratios during preparation of the elements of Ba, Eu, M, and Si in the mixture containing the raw materials of the oxynitride fluorescent materials of Examples 2 to 13 are shown in Table 1.

Comparative Example 1

Barium carbonate ($BaCO_3$), silicon oxide ($SiO_2$), silicon nitride ($Si_3N_4$), and europium oxide ($Eu_2O_3$) as raw materials were weighed, and the raw materials thus weighed were mixed with a dry ball mill to provide a mixture. An oxynitride fluorescent material of Comparative Example 1 was obtained in the same manner as in Example 1 except that the mixture prepared above was used. The molar ratios during preparation of the elements of Ba, Eu, and Si in the mixture containing the raw materials of the oxynitride fluorescent material of Comparative Example 1 is shown in Table 1.

Comparative Example 2

Barium carbonate ($BaCO_3$), silicon oxide ($SiO_2$), silicon nitride ($Si_3N_4$), europium oxide ($Eu_2O_3$), and samarium oxide ($Sm_2O_3$) as raw materials were weighed, and the raw materials thus weighed were mixed with a dry ball mill to provide a mixture. An oxynitride fluorescent material of Comparative Example 2 was obtained in the same manner as in Example 1 except that the mixture prepared above was used. The molar ratios during preparation of the elements of Ba, Eu, M, and Si in the mixture containing the raw materials of the oxynitride fluorescent material of Comparative Example 2 is shown in Table 1.

Examples 14 to 17

Barium carbonate ($BaCO_3$), silicon oxide ($SiO_2$), silicon nitride ($Si_3N_4$), europium oxide ($Eu_2O_3$), and an oxide containing a rare earth element as raw materials were weighed, and the raw materials thus weighed were mixed with a dry ball mill to provide a mixture. The oxide containing a rare earth element used was specifically lanthanum oxide ($La_2O_3$), cerium oxide ($CeO_2$), praseodymium oxide ($Pr_6O_{11}$), or neodymium oxide ($Nd_2O_3$). Oxynitride fluorescent materials of Examples 14 to 17 were obtained in the same manner as in Example 1 except that the mixture prepared above was used. The molar ratios during preparation of the elements of Ba, Eu, M, and Si in the mixture containing the raw materials of the oxynitride fluorescent materials of Examples 14 to 17 are shown in Table 1.

Comparative Examples 3 and 4

Barium carbonate ($BaCO_3$), silicon oxide ($SiO_2$), silicon nitride ($Si_3N_4$), europium oxide ($Eu_2O_3$), and lanthanum oxide ($La_2O_3$) as raw materials were weighed, and the raw materials thus weighed were mixed with a dry ball mill to provide a mixture. Oxynitride fluorescent materials of Comparative Examples 3 and 4 were obtained in the same manner as in Example 1 except that the mixture prepared above was used. The oxynitride fluorescent materials of Comparative Examples 3 and 4 each were prepared by using a mixture having a molar ratio of La as a rare earth element contained in the mixture was 0.15 or more assuming that the molar ratio of Si contained in the mixture was 2 in the preparation of the composition. The molar ratios during preparation of the elements of Ba, Eu, M, and Si in the mixture containing the raw materials of the oxynitride fluorescent materials of Comparative Examples 3 and 4 are shown in Table 1.

Compositional Analysis

The oxynitride fluorescent materials obtained in Examples 1 to 17 and Comparative Examples 1 to 4 were measured for the molar ratios of the elements of Ba, Eu, M, Si, O and N by the ICP emission spectrometry method with an induction coupled plasma emission spectrometer (manufacture by PerkinElmer, Inc.). The results are shown in Table 2. The molar ratios of the elements in the oxynitride fluorescent materials thus analyzed were molar ratios assuming the molar ratio of Si as 2.

Average Particle Diameter

The oxynitride fluorescent materials obtained in Examples 1 to 17 and Comparative Examples 1 to 4 were measured for the average particle diameter with a laser diffraction particle size distribution measuring instrument (Mastersizer 3000, manufactured by Malvern Panalytical, Ltd.). The average particle diameter of the oxynitride fluorescent materials referred in the description herein is the particle diameter where the volume cumulative frequency reaches 50% from the small diameter side (D50: median diameter). The results are shown in Table 2.

Light Emission Characteristics: Measurement of Light Emission Spectrum

The oxynitride fluorescent materials obtained in Examples 1 to 17 and Comparative Examples 1 to 4 were measured for the light emission characteristics. For the light emission characteristics of the powder of the oxynitride fluorescent material, the light emission spectrum thereof was measured with a spectrofluorophotometer (QE-2000, manufactured by Otsuka Electronics Co., Ltd.) with excitation light having a wavelength of 450 nm. The oxynitride fluorescent materials obtained in Examples and Comparative Examples each emitted blue-green light with light from an excitation light source having a light emission peak wavelength of 450 nm. The oxynitride fluorescent materials obtained in Examples 1 to 17 and Comparative Examples 1 and 3 each had a light emission peak wavelength of 494 nm, and the oxynitride fluorescent materials obtained in Comparative Examples 2 and 4 each had a light emission peak wavelength of 493 nm.

Relative Light Emission Energy (%)

Figure 2:
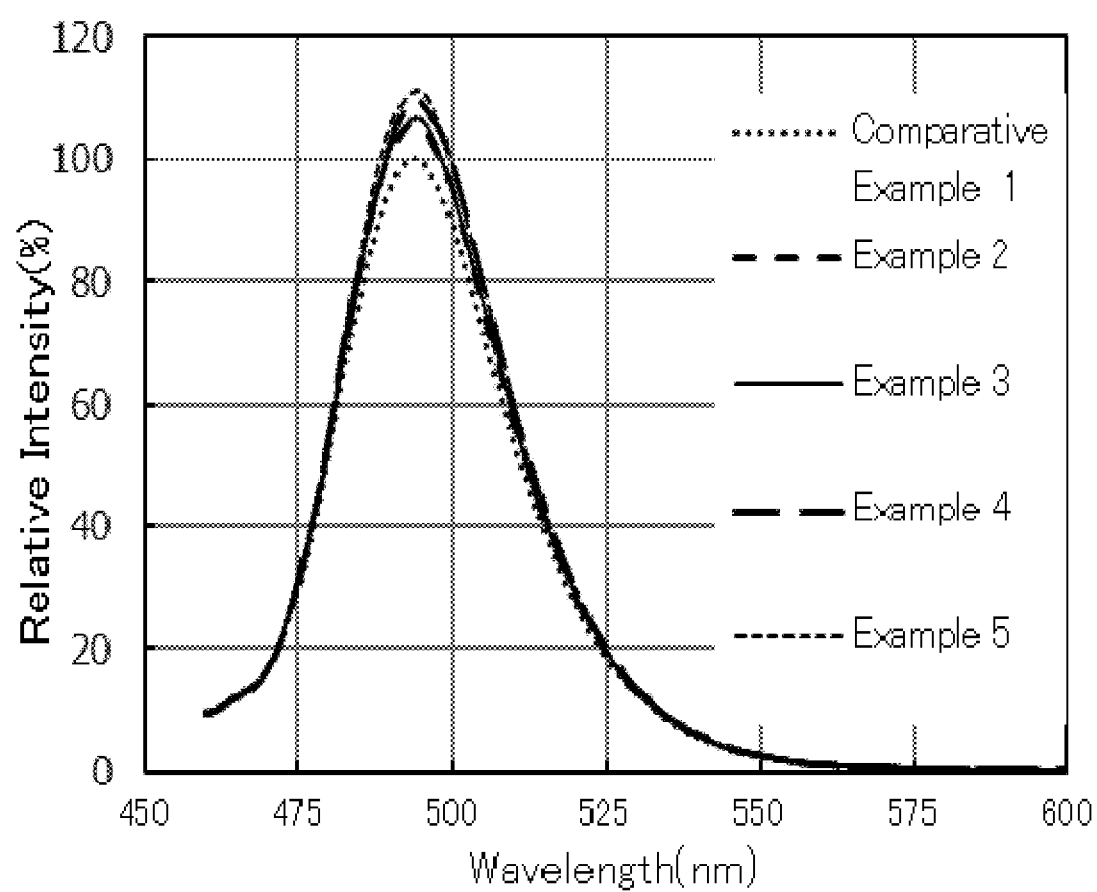
FIG. 2 shows the light emission spectra of the relative light emission energy (%) with respect to the wavelength (nm) of the oxynitride fluorescent materials of Examples 2 to 5 and Comparative Example 1.
Figure 3:
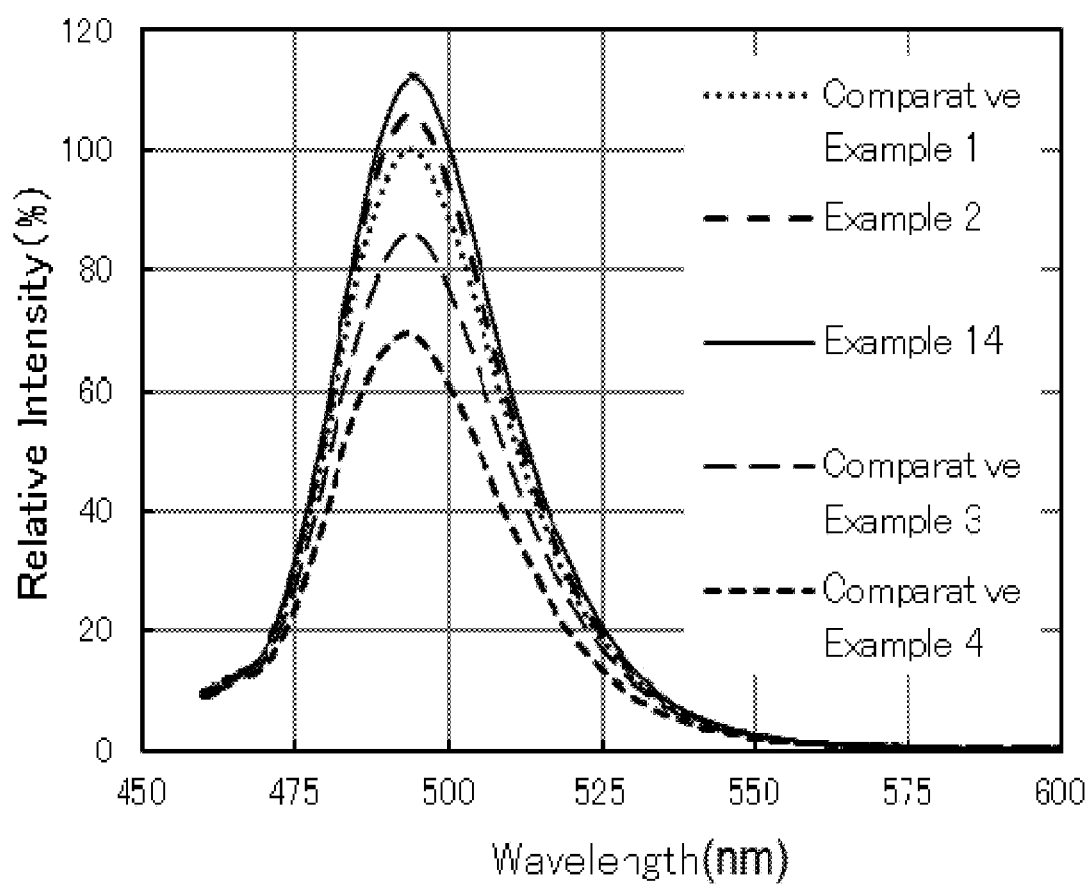
FIG. 3 shows the light emission spectra of the oxynitride fluorescent materials of Examples 2 and 14 and Comparative Examples 1, 3, and 4.

From the light emission spectra obtained by measuring the oxynitride fluorescent materials obtained in Examples 1 to 17 and Comparative Examples 1 to 4, the relative light emission energy values of Examples and Comparative Examples were obtained assuming that the light emission energy value of the oxynitride fluorescent material of Comparative Example 1 was 100%. The light emission energy value is the integrated value of the light emission spectrum in a range of a wavelength of 470 nm or more and 550 nm or less in the spectrum. The results are shown in Table 2. FIG. 2 is a diagram showing the light emission spectra of the oxynitride fluorescent materials of Examples 2 to 5 and Comparative Example 1. FIG. 3 is a diagram showing the light emission spectra of the oxynitride fluorescent materials of Examples 2 and 14 and Comparative Examples 1, 3, and 4.

SEM Micrograph

Figure 4:
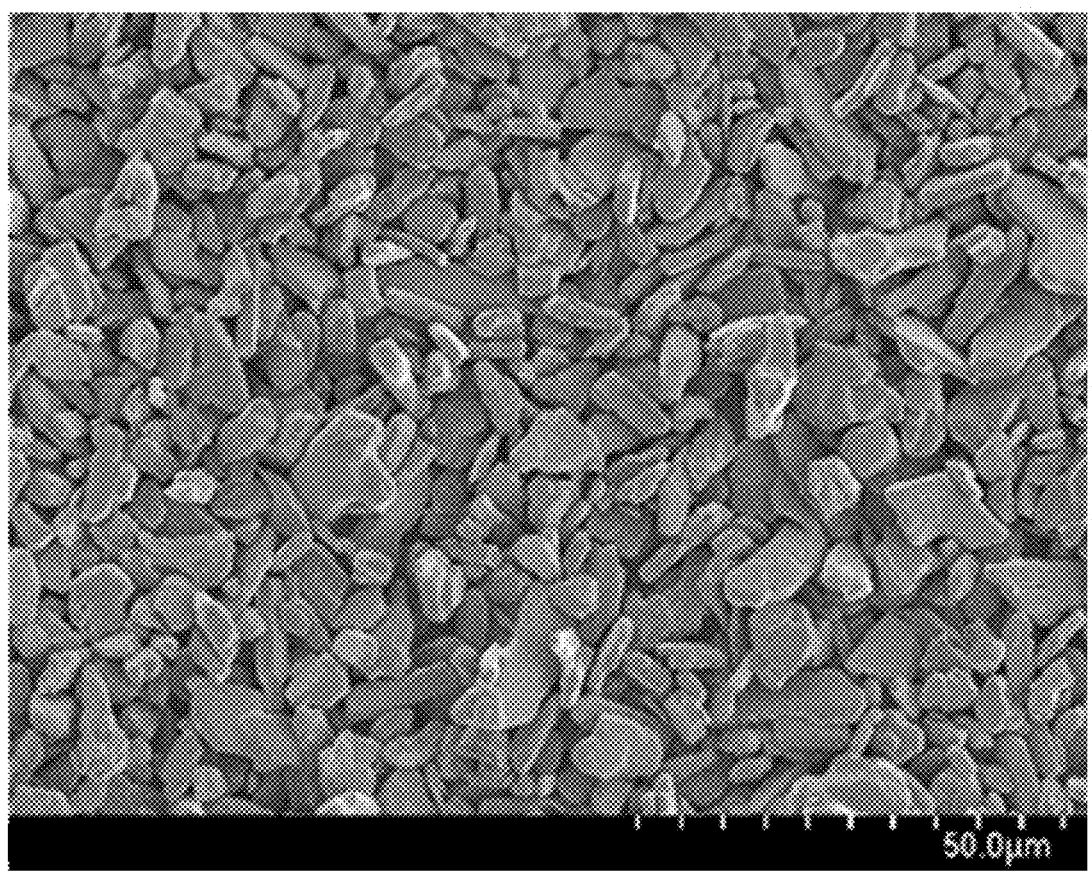
FIG. 4 is the SEM micrograph showing the oxynitride fluorescent material of Example 2.
Figure 5:
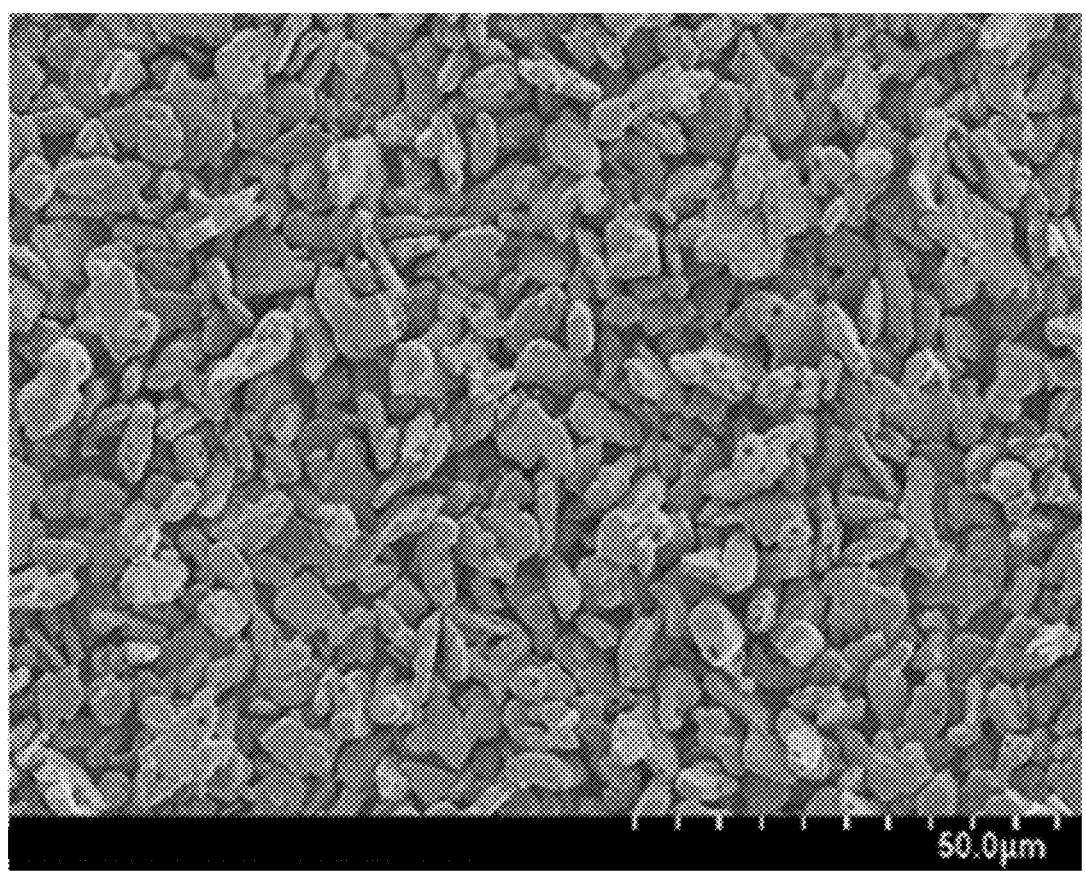
FIG. 5 is the SEM micrograph showing the oxynitride fluorescent material of Comparative Example 1.

Using a scanning electron microscope (SEM), SEM micrographs of the oxynitride fluorescent materials in Example 2 and Comparative Example 1 were obtained. FIG. 4 is the SEM micrograph showing the oxynitride fluorescent material of Example 2, and FIG. 5 is the SEM micrograph of the oxynitride fluorescent material showing Comparative Example 1.

TABLE 1

| | Molar ratio during preparation | | | |
|---|---|---|---|---|
| | | | Element M (rare earth | |
| | Ba | Eu | element) | Si |
| Comparative Example 1 | 0.980 | 0.020 | — | 0.000 | 2.000 |
| Example 1 | 0.980 | 0.020 | Y | 0.074 | 2.000 |
| Example 2 | 0.980 | 0.020 | La | 0.047 | 2.000 |
| Example 3 | 0.980 | 0.020 | Ce | 0.047 | 2.000 |
| Example 4 | 0.980 | 0.020 | Pr | 0.041 | 2.000 |
| Example 5 | 0.980 | 0.020 | Nd | 0.045 | 2.000 |
| Comparative Example 2 | 0.980 | 0.020 | Sm | 0.044 | 2.000 |
| Example 6 | 0.980 | 0.020 | Gd | 0.042 | 2.000 |
| Example 7 | 0.980 | 0.020 | Tb | 0.042 | 2.000 |
| Example 8 | 0.980 | 0.020 | Dy | 0.040 | 2.000 |
| Example 9 | 0.980 | 0.020 | Ho | 0.040 | 2.000 |
| Example 10 | 0.980 | 0.020 | Er | 0.039 | 2.000 |
| Example 11 | 0.980 | 0.020 | Tm | 0.039 | 2.000 |
| Example 12 | 0.980 | 0.020 | Yb | 0.038 | 2.000 |
| Example 13 | 0.980 | 0.020 | Lu | 0.037 | 2.000 |
| Example 14 | 0.980 | 0.020 | La | 0.097 | 2.000 |
| Example 15 | 0.980 | 0.020 | Ce | 0.097 | 2.000 |
| Example 16 | 0.980 | 0.020 | Pr | 0.096 | 2.000 |
| Example 17 | 0.980 | 0.020 | Nd | 0.093 | 2.000 |
| Comparative Example 3 | 0.980 | 0.020 | La | 0.150 | 2.000 |
| Comparative Example 4 | 0.980 | 0.020 | La | 0.207 | 2.000 |

TABLE 2

| | Molar ratios of elements of fluorescent material (analysis value) | | | | | | Fluorescent material | |
|---|---|---|---|---|---|---|---|---|
| | Ba | Eu | Element M (rare earth element) | | Si | O | N | Average particle | Relative light emission |
| | 1 − a | a | Element M | b | — | 2 + c | 2 + d | diameter (μm) | energy (%) |
| Comparative Example 1 | 0.904 | 0.0159 | none | — | 2.000 | 2.08 | 1.80 | 7.3 | 100.0 |
| Example 1 | 0.904 | 0.0127 | Y | 0.0013 | 2.000 | 1.92 | 2.00 | 7.5 | 103.2 |
| Example 2 | 0.909 | 0.0140 | La | 0.0149 | 2.000 | 2.01 | 1.91 | 7.5 | 106.0 |
| Example 3 | 0.914 | 0.0119 | Ce | 0.0061 | 2.000 | 2.06 | 1.84 | 8.0 | 106.2 |
| Example 4 | 0.918 | 0.0141 | Pr | 0.0085 | 2.000 | 2.02 | 2.01 | 7.8 | 108.9 |
| Example 5 | 0.913 | 0.0139 | Nd | 0.0073 | 2.000 | 2.01 | 1.94 | 9.0 | 109.0 |
| Comparative Example 2 | 0.921 | 0.0141 | Sm | 0.0005 | 2.000 | 2.10 | 1.84 | 7.5 | 97.4 |
| Example 6 | 0.917 | 0.0142 | Gd | 0.0023 | 2.000 | 1.97 | 1.72 | 7.5 | 111.6 |
| Example 7 | 0.923 | 0.0146 | Tb | 0.0011 | 2.000 | 2.04 | 1.88 | 7.9 | 110.9 |
| Example 8 | 0.922 | 0.0145 | Dy | 0.0012 | 2.000 | 2.00 | 1.91 | 8.1 | 111.6 |
| Example 9 | 0.914 | 0.0145 | Ho | 0.0007 | 2.000 | 2.05 | 2.04 | 8.2 | 109.3 |
| Example 10 | 0.913 | 0.0142 | Er | 0.0006 | 2.000 | 1.92 | 1.86 | 7.8 | 107.8 |
| Example 11 | 0.912 | 0.0140 | Tm | 0.0007 | 2.000 | 2.01 | 1.82 | 7.9 | 106.5 |
| Example 12 | 0.908 | 0.0144 | Yb | 0.0007 | 2.000 | 2.00 | 1.94 | 6.5 | 101.5 |
| Example 13 | 0.914 | 0.0142 | Lu | 0.0006 | 2.000 | 1.99 | 1.81 | 7.5 | 104.8 |
| Example 14 | 0.924 | 0.0145 | La | 0.0361 | 2.000 | 1.99 | 1.97 | 8.5 | 111.2 |
| Example 15 | 0.908 | 0.0106 | Ce | 0.0058 | 2.000 | 1.94 | 1.82 | 8.4 | 106.8 |
| Example 16 | 0.860 | 0.0143 | Pr | 0.0241 | 2.000 | 2.20 | 1.84 | 8.5 | 105.4 |
| Example 17 | 0.859 | 0.0148 | Nd | 0.0425 | 2.000 | 2.21 | 1.83 | 8.8 | 104.4 |
| Comparative Example 3 | 0.880 | 0.0135 | La | 0.0794 | 2.000 | 2.35 | 1.78 | 10.2 | 89.3 |
| Comparative Example 4 | 0.870 | 0.0120 | La | 0.1043 | 2.000 | 2.33 | 1.74 | 8.0 | 73.5 |

Discussion on Oxynitride Fluorescent Materials

As shown in Table 2, the oxynitride fluorescent materials of Examples 1 to 17 containing at least one kind of a rare earth element selected from the group consisting of rare earth elements excluding Eu and Sm, along with Eu each were efficiently excited with light from the light emitting element having a light emission peak wavelength of 450 nm, and thus had larger relative light emission energy than Comparative Example 1 containing no rare earth element other than Eu. The oxynitride fluorescent materials of Examples 1 to 17 each contained a composition represented by the formula (I) and contained Eu as an activating element and M wherein M is at least one kind of element selected from the group consisting of rare earth elements excluding Eu and Sm. It was estimated that the compound containing M functioned as a flux in the calcining step, so as to provide an oxynitride fluorescent material having high crystallinity with less defects.

As shown in Table 2, the oxynitride fluorescent material of Comparative Example 2 contained Sm, and had smaller relative light emission energy than the oxynitride fluorescent material of Comparative Example 1 containing no rare earth element other than Eu. The mechanism of the decrease of the relative light emission energy of the oxynitride fluorescent material containing Sm of Comparative Example 2 is not clear, but it is estimated as follows. Sm tends to become a divalent positive charge, as similar to Eu, and thus is difficult to keep balance between the negative charge including oxygen and nitrogen and the positive charge including Ba, Eu, Sm, and Si in the composition of the fluorescent material, and difficult to incorporated in the composition of the fluorescent material, as compared to M tending to become a trivalent positive charge. Accordingly, the compound of Sm has a weak function as a flux in the calcining step, thereby failing to provide a fluorescent material having high crystallinity. As shown in Table 1, the oxynitride fluorescent materials of Comparative Examples 3 and 4 each had a molar ratio during preparation of La as a rare earth element contained in the mixture as a raw material of 0.15 or more, and thus the resulting oxynitride fluorescent materials of Comparative Examples 3 and 4 each had a parameter b showing the molar ratio of M exceeding 0.07 in the composition represented by the formula (I). Accordingly, in the oxynitride fluorescent materials of Comparative Examples 3 and 4, it was estimated that the amount of M incorporated to the crystal structure was too large, and the energy that was supposed to contribute to the light emission of Eu as an activator element was actually absorbed by M, resulting in decrease of the relative light emission energy.

As shown in FIG. 2, the light emission spectra of the oxynitride fluorescent materials of Examples 2 to 5 each had a higher relative intensity than the light emission spectrum of the oxynitride fluorescent material of Comparative Example 1.

As shown in FIG. 3, the oxynitride fluorescent materials of Examples 2 and 14 each had a parameter b showing the molar ratio of La as M in a range of more than 0 and 0.07 or less in the composition represented by the formula (I), and exhibited a tendency that the relative intensity was higher than Comparative Example 1. As shown in FIG. 3, on the other hand, the oxynitride fluorescent materials of Comparative Examples 3 and 4 each had a parameter b showing the molar ratio of M exceeding 0.07 in the composition represented by the formula (I), and the energy that was supposed to contribute to the light emission was actually absorbed by La due to the too large amount of La incorporated in the crystal structure, resulting in decrease of the relative intensity, as compared to Comparative Example 1.

As shown in the SEM micrograph in FIG. 4, the oxynitride fluorescent material of Example 2 had a relatively smooth surface, and exhibited a tendency that the particle diameter thereof was larger than the oxynitride fluorescent material of Comparative Example 1. As shown in Table 2, the oxynitride fluorescent materials of Examples 2 to 11 and 13 to 17 excluding Example 12 each had a larger average particle diameter than the oxynitride fluorescent material of Comparative Example 1. It was estimated that the relatively smooth surface of the oxynitride fluorescent material of Example 2 was obtained since fluorescent material particles having high crystallinity with less defects were obtained.

As shown in the SEM micrograph in FIG. 5, it was confirmed that the oxynitride fluorescent material of Comparative Example 1 had fine pores formed on the surface of the fluorescent material particles. It was estimated that the fine pores on the surface of the particles of the oxynitride fluorescent material of Comparative Example 1 were pores that were formed through incorporation of many Ba atoms into the crystal structure and then removal of the unstable Ba by the post-treatment.

Production of Light Emitting Devices of Examples 1 to 5 and 14 to 17 and Comparative Examples 1 to 4

As shown in FIG. 1, an LED chip formed of a nitride semiconductor having a light emission peak wavelength of 450 nm as the light emitting element 10 was disposed on a bottom surface of a depressed portion of the molded article 40, and the first lead 20 and the second lead 30 of the light emitting element 10 were connected to the wires 60. The oxynitride fluorescent materials of Examples 1 to 5 and 14 to 17 and Comparative Examples 1 to 4 each were added as the first fluorescent material 71 to a silicone resin to make mixed light emitted from the light emitting device having an x value and a y value of the CIE chromaticity coordinate of approximately 0.128 and 0.150 respectively, and mixed and dispersed to provide a composition for a fluorescent member. An appropriate amount of the composition for a fluorescent member was charged in the depressed portion of the molded article 40, and the resin in the composition for a fluorescent member was cured to form the fluorescent member 50, thereby providing the light emitting device 100.

Evaluation of Light Emitting Device
Light Emission Characteristics

Figure 6:
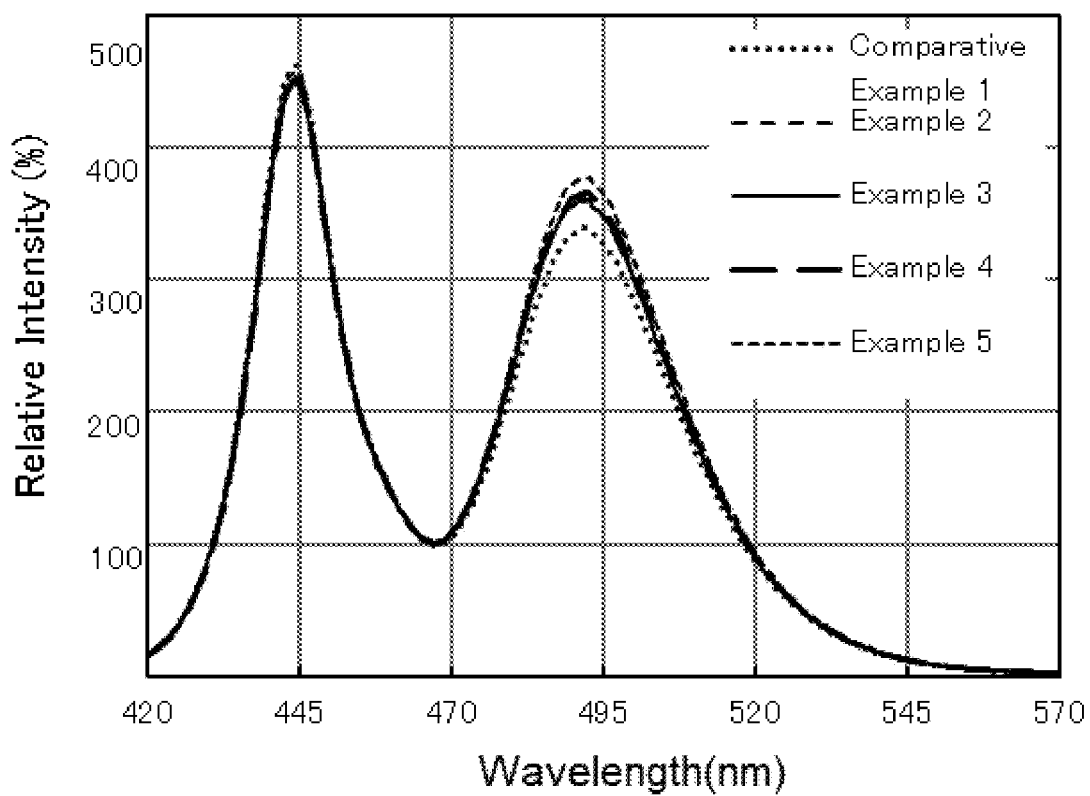
FIG. 6 shows the light emission spectra of light emitting devices of Examples 2 to 5 and Comparative Example 1.

The light emitting devices of Examples 2 to 5 and Comparative Example 1 each were measured for the light emission spectrum with a spectrofluorophotometer (F-4500, manufactured by Hitachi High-Technologies Corporation, product name). The results are shown in FIG. 6.

Evaluation of Reliability of Light Emitting Device 1
Relative Luminous Flux after Continuous Lighting (Po)

The light emitting devices of Examples 1 to 5 and 14 to 17 and Comparative Examples 1 to 4 each were continuously lightened at 85° C. and a current of 150 mA for 1,000 hours. The light emitting device of Comparative Example 1 was measured for the luminous flux after the continuous lighting for 1,000 hours with a total luminous flux measuring device using an integrating sphere, and assuming that the luminous flux of the light emitting device of Comparative Example 1 after the continuous lighting was designated as 100%, the relative luminous fluxes (%) of the light emitting devices of Examples 1 to 5 and 14 to 17 and Comparative Examples 1 to 4 were calculated. The results are shown in Table 3.

Figure 7:
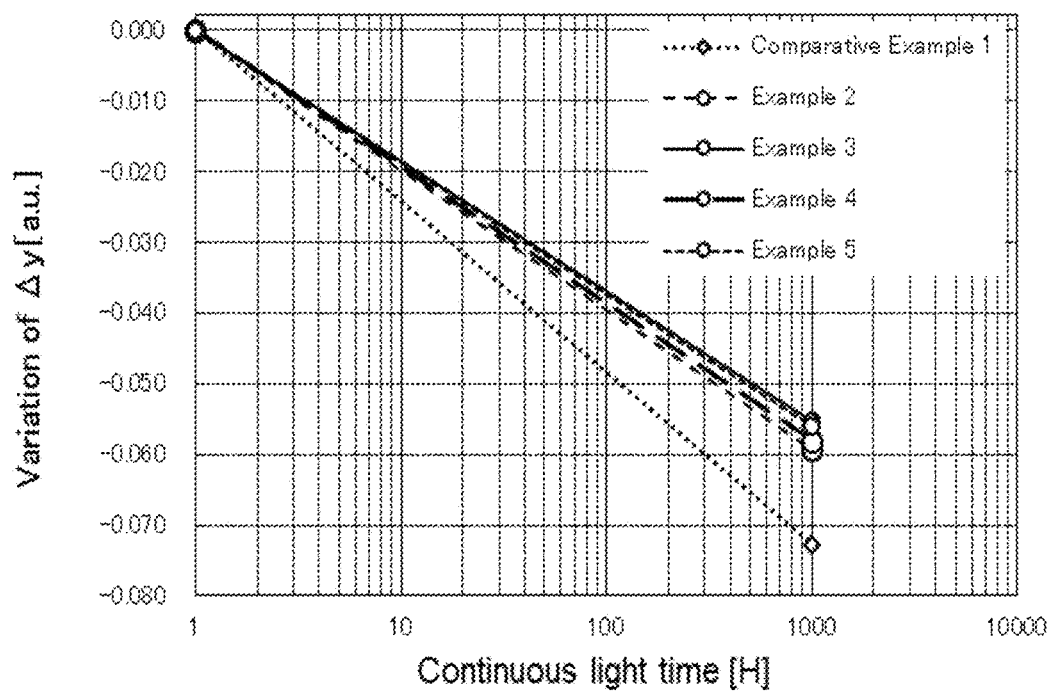
FIG. 7 is a graph showing the variations of Δy from the initial stage to after continuous lighting for 1,000 hours of the light emitting devices of Examples 2 to 5 and Comparative Example 1.
Figure 8:
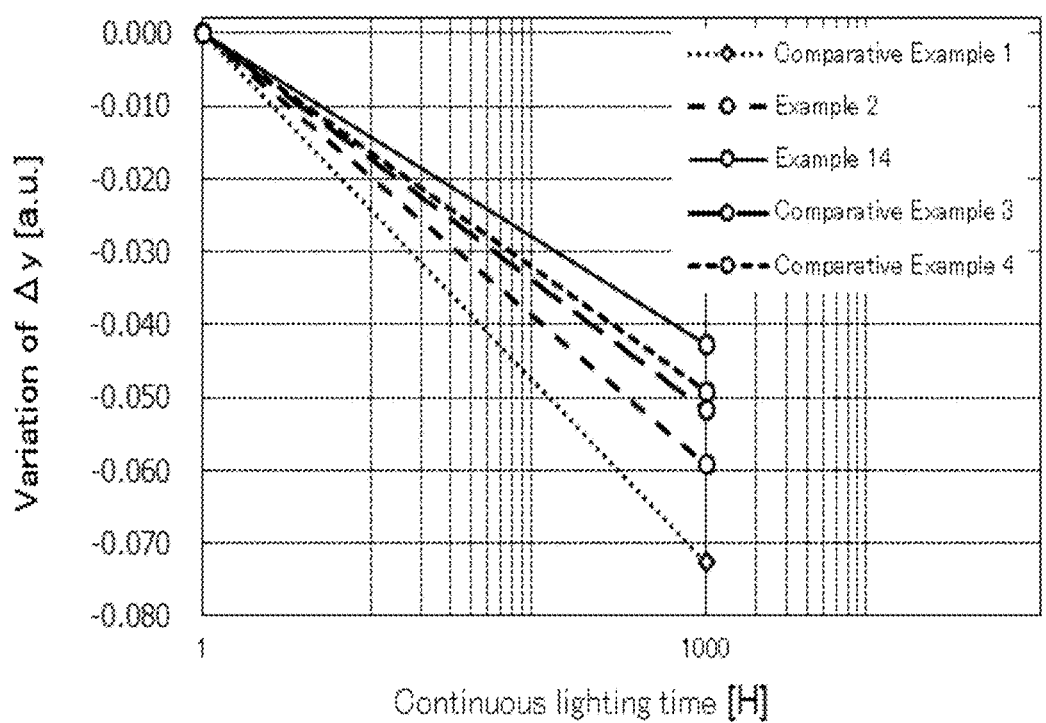
FIG. 8 is a graph showing the variations of Δy from the initial stage to after continuous lighting for 1,000 hours of light emitting devices of Examples 2 and 14 and Comparative Examples 1, 3, and 4.

Evaluation of Reliability of Light Emitting Device 2
Variation and Relative Variation Rate (%) of Difference Δy of y Value of CIE Chromaticity Coordinate before and after Storage The light emitting devices of Examples 1 to 5 and 14 to 17 and Comparative Examples 1 to 4 each were continuously lightened at 85° C. and a current of 150 mA for 1,000 hours. A value of y1 in the CIE chromaticity coordinate before the continuous lighting and a value of y2 in the CIE chromaticity coordinate after the continuous lighting for 1,000 hours were measured with a multi-channel spectral analyzer (PMA-12, manufactured by Hamamatsu Photonics K.R.), and the difference Δy between the value of y1 and the value of y2 was calculated as an absolute value. The results are shown in Table 3. The difference Δy of the light emitting device of Comparative Example 1 before and after the continuous lighting for 1,000 hours was normalized to 100%. The results on the light emitting devices of Examples 1 to 5 and 14 to 17 and Comparative Examples 1 to 4 were expressed as relative variation rates (%) of Δy. The results are shown in Table 3. FIG. 7 is a graph showing the variations of Δy from the initial stage to after the continuous lighting for 1,000 hours of the light emitting devices of Examples 2 to 5 and Comparative Example 1. FIG. 8 is a graph showing the variations of Δy from the initial stage to after the continuous lighting for 1,000 hours of the light emitting devices of Examples 2 and 14 and Comparative Examples 1, 3, and 4.

Evaluation of Reliability of Oxynitride Fluorescent Material
Evaluation of Temperature Characteristics, Relative Light Emission Energy (%)

Figure 9:
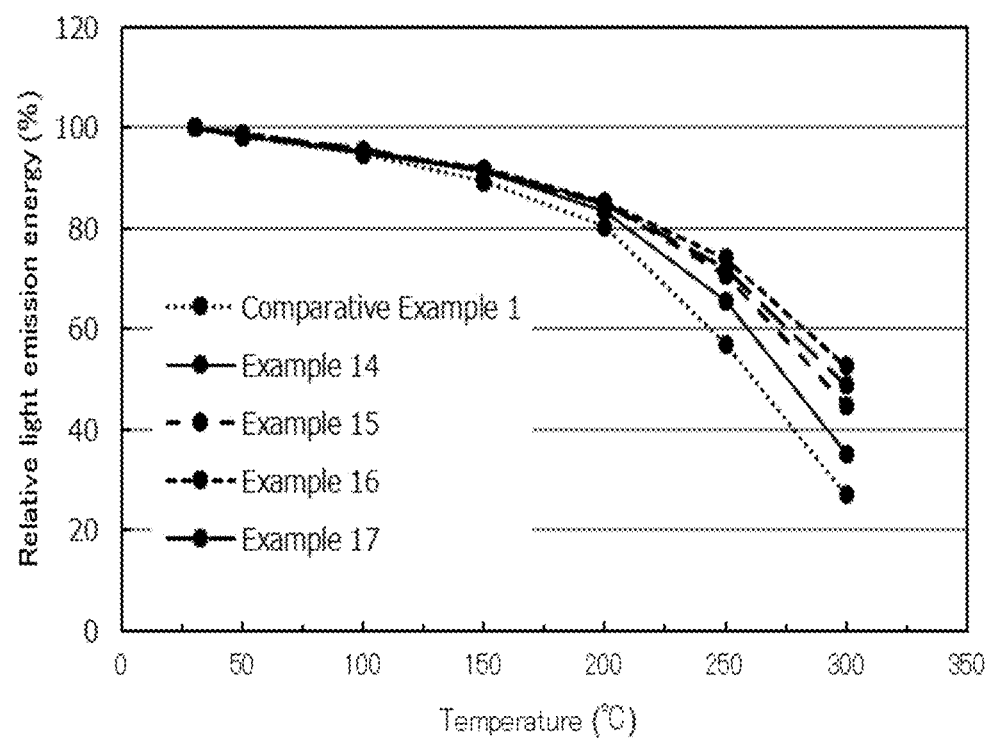
FIG. 9 is a graph showing the relative light emission energy (%) of the oxynitride fluorescent materials of Examples 14 to 17 and Comparative Example 1 emitted light at temperatures in a temperature range of from room temperature (approximately 25° C.) to 300° C.

The oxynitride fluorescent materials of Examples 14 to 17 and Comparative Example 1 each were emitted light at temperatures in a temperature range of from room temperature (25° C.) to 300° C., and the light emission spectra of the oxynitride fluorescent materials excited with light emitted from the excitation light source having a light emission peak wavelength of 450 nm each were measured with a spectrofluorophotometer (F-4500E, manufactured by Hitachi High-Tech Science Corporation). Assuming that the energy value of the light emission spectrum measured at 25° C. of each of the oxynitride fluorescent materials of Examples and Comparative Examples was designated as 100%, the relative energy values of the light emission spectrum (relative light emission energy (%)) at the temperatures of each of the oxynitride fluorescent materials of Examples and Comparative Examples were obtained. The energy value herein is the relative integrated value of the light emission spectrum in a wavelength range of 470 nm or more and 550 nm or less obtained at the designated temperature. FIG. 9 is a graph showing the relative light emission energy (%) of the oxynitride fluorescent materials of Examples 14 to 17 and Comparative Example 1 operated at temperatures in a temperature range of from room temperature (25° C.) to 300° C.

TABLE 3

| | Molar ratios of elements of fluorescent material (analysis value) | | | | | | | Light emitting device | |
|---|---|---|---|---|---|---|---|---|---|
| | Ba | Eu | Element M (rare earth element) | | Si | O | N | Relative luminous | Variation of $\Delta y$ after continuous lighting for 1,000 hours | Relative variation |
| | 1 − a | a | Element M | b | — | 2 + c | 2 + d | flux (%) | (absolute value) | rate of $\Delta y$ (%) |
| Comparative Example 1 | 0.904 | 0.0159 | none | — | 2.000 | 2.08 | 1.80 | 100.0 | 0.0727 | 100.0 |
| Example 1 | 0.904 | 0.0127 | Y | 0.0013 | 2.000 | 1.92 | 2.00 | 102.0 | 0.0683 | 94.0 |
| Example 2 | 0.909 | 0.0140 | La | 0.0149 | 2.000 | 2.01 | 1.91 | 103.9 | 0.0593 | 81.6 |
| Example 3 | 0.914 | 0.0119 | Ce | 0.0061 | 2.000 | 2.06 | 1.84 | 105.0 | 0.0466 | 76.1 |
| Example 4 | 0.918 | 0.0141 | Pr | 0.0085 | 2.000 | 2.02 | 2.01 | 104.7 | 0.0581 | 79.9 |
| Example 5 | 0.913 | 0.0139 | Nd | 0.0073 | 2.000 | 2.01 | 1.94 | 106.5 | 0.0560 | 77.0 |
| Comparative Example 2 | 0.921 | 0.0141 | Sm | 0.0005 | 2.000 | 2.10 | 1.84 | 100.5 | 0.0728 | 100.2 |
| Example 14 | 0.924 | 0.0145 | La | 0.0361 | 2.000 | 1.99 | 1.97 | 98.0 | 0.0428 | 58.9 |
| Example 15 | 0.908 | 0.0106 | Ce | 0.0058 | 2.000 | 1.94 | 1.82 | 101.0 | 0.0510 | 70.1 |
| Example 16 | 0.860 | 0.0143 | Pr | 0.0241 | 2.000 | 2.20 | 1.84 | 100.1 | 0.0518 | 71.2 |
| Example 17 | 0.859 | 0.0148 | Nd | 0.0425 | 2.000 | 2.21 | 1.83 | 101.2 | 0.0541 | 74.4 |
| Comparative Example 3 | 0.880 | 0.0135 | La | 0.0794 | 2.000 | 2.35 | 1.78 | 96.9 | 0.0517 | 71.2 |
| Comparative Example 4 | 0.870 | 0.0120 | La | 0.1043 | 2.000 | 2.33 | 1.74 | 83.7 | 0.0492 | 67.6 |

Discussion on Light Emitting Devices

As shown in Table 3, the light emitting devices using the oxynitride fluorescent materials of Examples 1 to 5 and 15 to 17 containing at least one kind of a rare earth element selected from the group consisting of rare earth elements excluding Eu and Sm, along with Eu each had a high relative luminous flux. The light emitting device of Example 14 had a relative luminous flux that was slightly lower than the light emitting device of Comparative Example 1, but had a variation of $\Delta y$ after the continuous lighting for 1,000 hours that was smaller than the light emitting devices of Examples 1 to 5 and 15 to 17, and the smallest relative variation rate of $\Delta y$ of 58.9%, and thus the color variation was suppressed even under continuous lighting for a prolonged period of time at a relatively high temperature of 85° C.

As shown in Table 3, on the other hand, the light emitting device of Comparative Example 2, which was supposed to have low crystallinity due to Sm contained, had a variation of $\Delta y$ that was increased beyond Comparative Example 1 under continuous lighting for a prolonged period of time at a relatively high temperature of 85° C., and an increased relative variation rate of $\Delta y$, and thus color variation occurred.

In the light emitting devices of Comparative Examples 3 and 4, the oxynitride fluorescent materials of Comparative Examples 3 and 4 in the light emitting devices each had a parameter b showing the molar ratio of La exceeding 0.07 in the composition represented by the formula (I), and it was estimated that the energy contributing to the light emission was absorbed by La due to the too large amount of La incorporated to the crystal structure, and thereby the relative luminous flux was lower than Comparative Example 1.

As shown in FIG. 6, the light emission spectra of the light emitting devices of Examples 2 to 5 each had a relative intensity in a wavelength range of 480 nm or more and 520 nm or less that was higher than the relative intensity of the light emission spectrum in a wavelength range of 480 nm or more and 520 nm or less of the light emitting device of Comparative Example 1, and thus the light emission characteristics were improved.

As shown in FIG. 7, even under the continuous lighting for a prolonged period of time of 1,000 hours at a relatively high temperature of 85° C., the light emitting devices of Examples 2 to 5 using the oxynitride fluorescent materials of Examples 2 to 5 containing at least one kind of a rare earth element selected from the group consisting of La, Ce, Pr, and Nd, along with Eu each had a variation of $\Delta y$ that was smaller than that of the light emitting device of the Comparative Example 1 under the continuous lighting under the same condition, and it was confirmed that the color variation was suppressed, and the temperature characteristics were improved. It was estimated that this was because the light emitting device contained an oxynitride fluorescent material having high crystallinity with less defects.

As shown in FIG. 8, in the light emitting devices of Examples 2 and 14, the parameter b showing the molar ratio of La as M was in a range of more than 0 and 0.07 or less in the composition represented by the formula (I), and it was confirmed that in this case, the variation of $\Delta y$ was decreased, the color variation was further suppressed, and the temperature characteristics were further improved, even under the continuous lighting for a prolonged period of time of 1,000 hours at a relatively high temperature of 85° C. In the light emitting devices of Comparative Examples 3 and 4, on the other hand, when the parameter b showing the molar ratio of La as M was increased beyond 0.07 in the composition represented by the formula (I), the color variation was not suppressed as compared to the light emitting device of Example 14.

Discussion on Oxynitride Fluorescent Materials

As shown in FIG. 9, in the oxynitride fluorescent materials of Examples 14 to 17, the decrease of the relative light emission energy was suppressed as compared to the light emitting device of Comparative Example 1 in the emission light at temperatures in a temperature range of from room temperature of 25° C. to 300° C., and thus the color variation was suppressed. The oxynitride fluorescent materials of Examples 14 to 17 each had high crystallinity with less defects, and thus the color variation was suppressed, and the temperature characteristics were improved, even under the operation at a high temperature of 300° C.

The oxynitride fluorescent material of the present invention can constitute a light emitting device by combining with an excitation light source. The light emitting device of the present invention can be favorably applied to illumination light sources, LED displays, light sources for backlight for liquid crystal devices, traffic signals, illuminated switches, various sensors, various indicators.

The invention claimed is:

1. An oxynitride fluorescent material comprising a composition represented by the following formula (I):

$$(Ba_{1-a}Eu_a)_{1-b}M_bSi_2O_{2+c}N_{2+d} \quad (I)$$

wherein in the formula (I), M represents at least one element selected from the group consisting of Pr, Nd, Tb, Ho, Er, Tm, and Yb; and a, b, c, and d each satisfy $0<a\ 1.0$, $0<b\leq0.07$, $-0.3<c<0.3$, and $-0.3<d<0.3$.

2. The oxynitride fluorescent material according to claim 1, wherein in the formula (I), M represents at least one element selected from the group consisting of Pr, and Nd, and a and b each satisfy $0.001\leq a<0.1$ and $0.001\ b\leq0.05$.

3. The oxynitride fluorescent material according to claim 1, wherein in the formula (I), a and b each satisfy $0.001\leq a\leq0.1$ and $0.001\leq b\leq0.05$.

4. The oxynitride fluorescent material according to claim 1, wherein in the formula (I), a satisfy $0.0106\leq a<0.1$.

5. A light emitting device comprising the oxynitride fluorescent material according to claim 1, and an excitation light source having a light emission peak wavelength in a range of 380 nm or more and 485 nm or less.

6. A method for producing the oxynitride fluorescent material according to claim 1, comprising:
preparing a mixture containing a compound containing Ba, a compound containing Eu, a compound containing M wherein M is at least one element selected from the group consisting of Pr, Nd, Tb, Ho, Er, Tm, and Yb, and a compound containing Si, any of the compounds being a compound containing oxygen, any of the compounds being a compound containing nitrogen; and
calcining the mixture.

7. The method for producing the oxynitride fluorescent material according to claim 6, wherein a molar ratio of M contained in the mixture is more than 0 and less than 0.15 assuming that a molar ratio of Si contained in the mixture is 2.

8. The method for producing the oxynitride fluorescent material according to claim 6, wherein the compound containing M is an oxide.

9. The method for producing the oxynitride fluorescent material according to claim 6, wherein a calcining temperature is within a range of 1,300° C. or more and 1,600° C. or less.

10. The method for producing the oxynitride fluorescent material according to claim 6, wherein the mixture is calcined in a reducing atmosphere that contains nitrogen.

11. The method for producing the oxynitride fluorescent material according to claim 10, wherein the reducing atmosphere further contains hydrogen gas in a range of 1% to 4% by volume.

* * * * *